US012796485B2

(12) United States Patent
Ramalingam et al.

(10) Patent No.: US 12,796,485 B2
(45) Date of Patent: Nov. 10, 2026

(54) METHOD FOR MANUFACTURING A SEMICONDUCTOR PACKAGE ASSEMBLY AS WELL AS A SEMICONDUCTOR PACKAGE ASSEMBLY OBTAINED WITH THIS METHOD

(71) Applicant: NEXPERIA B.V., Nijmegen (NL)

(72) Inventors: Vegneswary Ramalingam, Seremban (MY); Hans-Juergen Funke, Hamburg (DE)

(73) Assignee: Nexperia B.V., Nijmegen (NL)

( * ) Notice: Subject to any disclaimer, the term of this patent is extended or adjusted under 35 U.S.C. 154(b) by 305 days.

(21) Appl. No.: 18/753,745

(22) Filed: Jun. 25, 2024

(65) Prior Publication Data

US 2024/0429135 A1 Dec. 26, 2024

(30) Foreign Application Priority Data

Jun. 26, 2023 (EP) .................................... 23181337

(51) Int. Cl.

| | |
|---|---|
| ***H10W 70/40*** | (2026.01) |
| ***H10W 40/22*** | (2026.01) |
| ***H10W 70/04*** | (2026.01) |
| ***H10W 74/01*** | (2026.01) |
| ***H10W 74/10*** | (2026.01) |
| ***H10W 90/00*** | (2026.01) |

(52) U.S. Cl.

CPC ....... *H10W 70/429* (2026.01); *H10W 40/228* (2026.01); *H10W 70/041* (2026.01); *H10W 70/466* (2026.01); *H10W 74/016* (2026.01); *H10W 74/111* (2026.01); *H10W 90/811* (2026.01); *H10W 74/10* (2026.01); *H10W 90/754* (2026.01); *H10W 90/764* (2026.01)

(58) Field of Classification Search

None

See application file for complete search history.

(56) References Cited

U.S. PATENT DOCUMENTS

| | | | | |
|---|---|---|---|---|
| 2008/0054433 A1* | 3/2008 | Yoo | ...................... | H10W 90/00 257/E23.18 |
| 2017/0179009 A1* | 6/2017 | Otremba | ............... | H10W 40/10 |
| 2023/0317544 A1* | 10/2023 | Proschwitz | ........... | H10W 40/22 257/668 |

* cited by examiner

*Primary Examiner* — Alexander G Ghyka

(74) *Attorney, Agent, or Firm* — Ruggiero McAllister & McMahon LLC

(57) ABSTRACT

The present disclosure relates to a method for manufacturing semiconductor package assembly that includes a semiconductor package and a molding resin case. The present disclosure further provides an improved semiconductor package assembly capable of suppressing failures to limitations in package size.

16 Claims, 8 Drawing Sheets

METHOD FOR MANUFACTURING A SEMICONDUCTOR PACKAGE ASSEMBLY AS WELL AS A SEMICONDUCTOR PACKAGE ASSEMBLY OBTAINED WITH THIS METHOD

CROSS-REFERENCE TO RELATED APPLICATIONS

This application claims the benefit under 35 U.S.C. § 119 (a) of European Patent Application No. 23181337.9 filed Jun. 26, 2023, the contents of which are incorporated by reference herein in their entirety.

BACKGROUND

1. Field of the Disclosure

The present disclosure relates to a method for manufacturing a semiconductor package assembly consisting of a semiconductor package and a molding resin case.

2. Description of the Related Art

One critical property of semiconductor package assemblies for high voltage devices (>500V) is the creepage and clearance distance of the metal parts within the semiconductor package assembly. In high voltage applications the minimum creepage distance of electrical conductors is described, e.g. in IEC60664-1 and IPC2221A. The requirement for the minimum distances according to these standards is in contradiction to the trend for higher density electronics which require smaller package assemblies.

In known power semiconductor devices no proper solution is yet presented which incorporate a superior electrical insulation to mitigate the risk of electrical arcing for surface mounted devices. Moreover, power semiconductor devices require a large exposed heatsink element for an effective thermal dissipation of heat being generated. However, at higher operating voltages, the arcing risk is higher and thermal build-up inside the package will increase as well.

Accordingly, it is a goal of the present disclosure to provide an improved semiconductor package assembly capable of suppressing failures in case the distances as defined in the standard are violated e.g. due to limitations in package size.

SUMMARY

According to a first example of the disclosure, a method for manufacturing a semiconductor package assembly is proposed. The method comprising the steps of i) forming at least one semiconductor package by means of the sub-steps i1) providing a lead frame made from a metal material having a first frame side and a second frame side opposite to the first frame side as well as having at least two terminals; i2) providing at least one semiconductor die structure having a first die side and a second die side opposite to the first die side with its second die side on the first frame side of the lead frame; i3) electrically and mechanically attaching the at least one semiconductor die structure to the terminals of the lead frame; i4) attaching a heat sink element on the first die side and/or the second die side of the semiconductor die structure; and ii) encapsulating the at least one semiconductor die structure, the heat sink element and the plurality of terminals with a molding resin leaving at least a portion of the heat sink and at least a portion of the at least two terminals exposed. With the above steps at least one encapsulated semiconductor package assembly is formed.

The method further comprises the step of iii) providing, at least prior to the encapsulating step ii), a layer comprised of at least a silicate containing mineral on the lead frame and/or the semiconductor die structure adjacent to the heat sink element.

The silicate containing mineral mounted on the lead frame and/or the semiconductor die structure adjacent to the heat sink element, shields the latter from the leads of the lead frame and provides an improved creepage performance, in particular for top cool semiconductor package assemblies having a top surface heat sink. In addition, the presence of such silicate containing mineral allows to increase the design margins of the semiconductor package assembly, as it would be possible to develop package assemblies with larger heatsinks for step-up thermal dissipation.

In a further example of the method according to the disclosure step iii) is performed prior to step i2), and comprises providing an adhesive tape having an adhesive side and containing at least one layer comprised of the at least a silicate containing mineral on the adhesive side, and mounting at least the lead frame on the adhesive side of the adhesive tape.

The application of an adhesive tape as a back side tape in film-assisted molding techniques can support the manufacturability of thinner lead frames.

In a further example, in the method according to the disclosure step iii) is followed by the step of vi) removing the adhesive tape leaving the at least one layer comprised of the at least a silicate containing mineral exposed.

The present disclosure also pertains to a semiconductor package assembly consisting of a semiconductor package and a molding resin case as manufactured in accordance with one or more of the method claims of the present disclosure. In a particular example, the semiconductor package at least comprises a lead frame made from a metal material having a first frame side and a second frame side opposite to the first frame side as well as having at least two terminals; at least one semiconductor die structure having a first die side and a second die side opposite to the first die side with its second die side on the first frame side of the lead frame; a plurality of connections electrically and mechanically connecting the at least one semiconductor die structure with the terminals of the lead frame; at least one heat sink element mounted to the semiconductor die structure; and at least one layer comprised of at least a silicate containing mineral at least adjacent to the at least one heat sink element; and a molding resin encapsulating the at least one semiconductor die structure, the at least one heat sink element, the plurality of terminals and the at least one layer comprised of at least a silicate containing mineral with a molding resin leaving at least a portion of the heat sink and at least a portion of the at least two terminals exposed.

The silicate containing mineral mounted on the lead frame and/or the semiconductor die structure adjacent to the heat sink element, shields the latter from the leads of the lead frame and provides an improved creepage performance, in particular for top cool semiconductor package assemblies having a top surface heat sink. In addition, the presence of such silicate containing mineral allows to increase the design margins of the semiconductor package assembly, as it would be possible to develop package assemblies with larger heatsinks for step-up thermal dissipation.

Preferably, the silicate containing mineral is mica. Mica can be reinforced into a high stability composite, which provides a superior electrical insulation and is thus very useful in mitigating the risk of electrical arcing and creepage.

In particular, creepage is further mitigated as in an example, the at least one layer comprised of the at least a silicate containing mineral layer surrounds the heat sink element.

Alternatively, the at least one layer comprised of the at least a silicate containing mineral layer is positioned adjacent to the terminals of the lead frame.

BRIEF DESCRIPTION OF THE DRAWINGS

The disclosure will now be discussed with reference to the drawings, which show in.

DETAILED DESCRIPTION

Figure 1A:
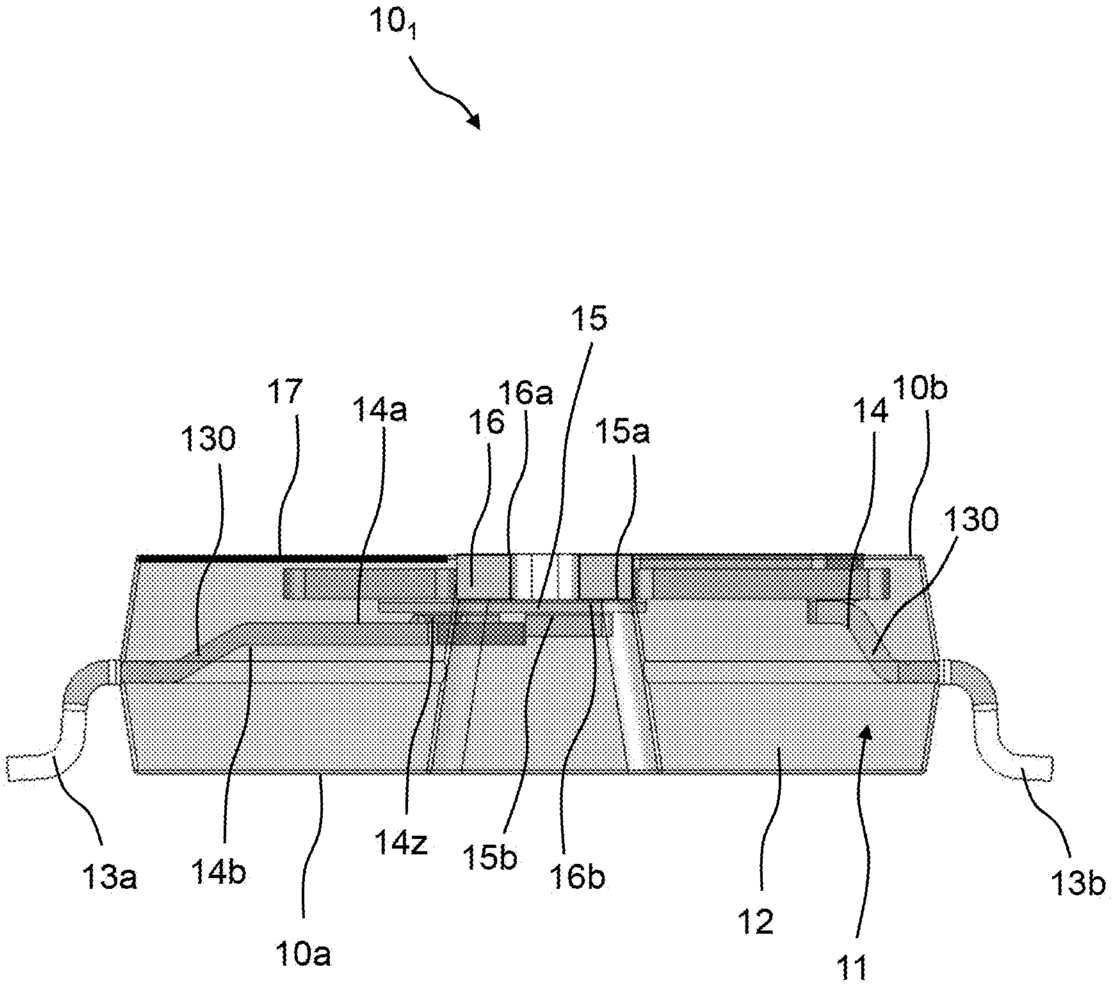
FIGS. 1A, 1B, 1C, 1D, 1E and 1F depict various examples of a singulated semiconductor package assembly according to the disclosure.

For a proper understanding of the disclosure, in the detailed description below corresponding elements or parts of the disclosure will be denoted with identical reference numerals in the drawings.

FIGS. 1A-1F depict various examples of a semiconductor package assembly according to the disclosure, which are indicated with reference numerals $\mathbf{10}_1$-$\mathbf{10}_6$, respectively.

As outlined in the introduction, one critical property of semiconductor package assemblies for high voltage devices (>500V) is the creepage and clearance distance of the metal parts within the semiconductor package assembly. In high voltage applications the minimum creepage distance of electrical conductors is described, e.g. in IEC60664-1 and IPC2221A. The requirement for the minimum distances according to these standards is in contradiction to the trend for higher density electronics which require smaller package assemblies.

In known power semiconductor devices no proper solution is yet presented which incorporate a superior electrical insulation to mitigate the risk of electrical arcing for surface mounted devices. Moreover, power semiconductor devices require a large exposed heatsink element for an effective thermal dissipation of heat being generated. However, at higher operating voltages, the arcing risk is higher and thermal build-up inside the package will increase as well.

Solutions for the above adverse effects of high voltages applied in a semiconductor package assembly according to the state of the art are depicted in the examples $\mathbf{10}_1$-$\mathbf{10}_6$ of FIGS. 1A-1F, respectively. The semiconductor package assemblies $\mathbf{10}_1$-$\mathbf{10}_6$ all consists of a semiconductor package 11 and a molding resin case 12, as shown in the cutaway FIG. 1A.

In all examples, the semiconductor package 11 is composed of a lead frame 14 having a first lead frame side 14*a* and a second lead frame side 14*b* opposite to the first lead frame side 14*a*. The lead frame 14 may also comprise at least two terminals, denoted as leads 13. A semiconductor die structure 15 has a first die side 15*a* and a second die side 15*b* opposite to the first die side 15*a* and is mounted with its second die side 15*b* on the first lead frame side 14*a* of the lead frame 14, for example at a die paddle 14*z*. In addition, one or more bond elements 130 may be provided which are electrically connected with relevant parts of the semiconductor die structure 15 with the leads 13. The bond elements may be bond clips of bond wires and extend into the leads 13.

In addition, a heat sink element 16 is provided having a planar configuration with a first heat sink side 16*a* and a second heat sink side 16*b* opposite to the first heat sink side 16*a*. The heat sink element 16 may be mechanically connected with either the lead frame 14 (thereby contacting the first lead frame side 14*a* with its second heat sink side 16*b*), or with the semiconductor die structure 15 (thereby contacting the first die side 15*a* or second die side 15*b* with its second heat sink side 16*b*).

As shown in FIG. 1A, the molding resin case 12 encapsulates at least the semiconductor die structure 15, the lead frame 14, the heat sink element 16 and the bond elements 130 and leaves a part of the bond element 130 partly exposed, thereby forming leads 13. Moreover, the first heat sink side 16*a* of the encapsulated heat sink element 16 is also not encapsulated by the molding resin case 12, but is exposed similar as the leads 13. The exposed first heat sink side 16*a* of the heat sink element 16 allows for a proper heat dissipation. The encapsulated semiconductor die structure 15, the lead frame 14, the heat sink element 16, and the bond element 130 (both its encapsulated part and exposed part, being the leads 13) are considered a semiconductor package assembly 10 ($\mathbf{10}_1$-$\mathbf{10}_6$).

Such semiconductor package assembly 10 ($\mathbf{10}_1$-$\mathbf{10}_6$) can be used in all kinds of electronics applications. To this end the semiconductor package assembly 10 ($\mathbf{10}_1$-$\mathbf{10}_6$) can be mounted to a Printed Circuit Board, PCB, note shown, by soldering the leads 13 (13-13*b*) at the relevant mounting locations on the PCB.

In power semiconductor devices which are operated at higher operating voltages, the arcing risk is higher and the thermal build-up inside the package will increase as well. In order to suppress failures in case the distances as defined in the standard are violated e.g. due to limitations in package size and to mitigate the risk of electrical arcing for surface mounted devices, at least one layer 17, 17*a*-1, 17*a*-2, 17*a*-3 is provided which layer 17, 17*a*-1, 17*a*-2, 17*a*-3 is comprised of at least a silicate containing mineral.

As depicted in the FIGS. 1A-1F, the at least one layer 17, 17*a*-1, 17*a*-2, 17*a*-3 comprised of at least a silicate containing mineral is provided at least adjacent to the heat sink element 16 and optionally also adjacent to the exposed leads 13*a*.

In this application it is observed that the exposed leads 13*b* may be connected to the drain and are also electrically connected to the heat sink 16, as clearly depicted in FIG. 1A. Accordingly, the leads 13*b* and the heat sink 16 are on the same potential level. The leads 13*a* are not electrically connected to the heat sink 16 and may be connected to the source and gate of the semiconductor die structure 15. The potential difference between the leads 13*a* and the heat sink 16 may induce a higher arcing risk and thermal build-up inside the package.

The molding resin 12 also encapsulates the at least one layer 17, 17*a*, 17*b*, yet in an exposed manner similar to the heat sink element 16.

The silicate containing mineral 17, 17*a*-1, 17*a*-2, 17*a*-3 mounted on the lead frame 14 and/or the semiconductor die structure 15 adjacent to the heat sink element 16 shields the latter from the leads 13*a* of the lead frame 14 and provides an improved creepage performance, in particular for top cool semiconductor package assemblies having a top surface heat sink element 16, as shown in the examples $\mathbf{10}_1$-$\mathbf{10}_6$ of the FIGS. 1A-1F.

In addition, the presence of such silicate containing mineral 17, 17*a*-1, 17*a*-2, 17*a*-3 allows to increase the design margins of the semiconductor package assembly, as it would be possible to develop package assemblies with larger heatsinks for step-up thermal dissipation.

Figure 1B:
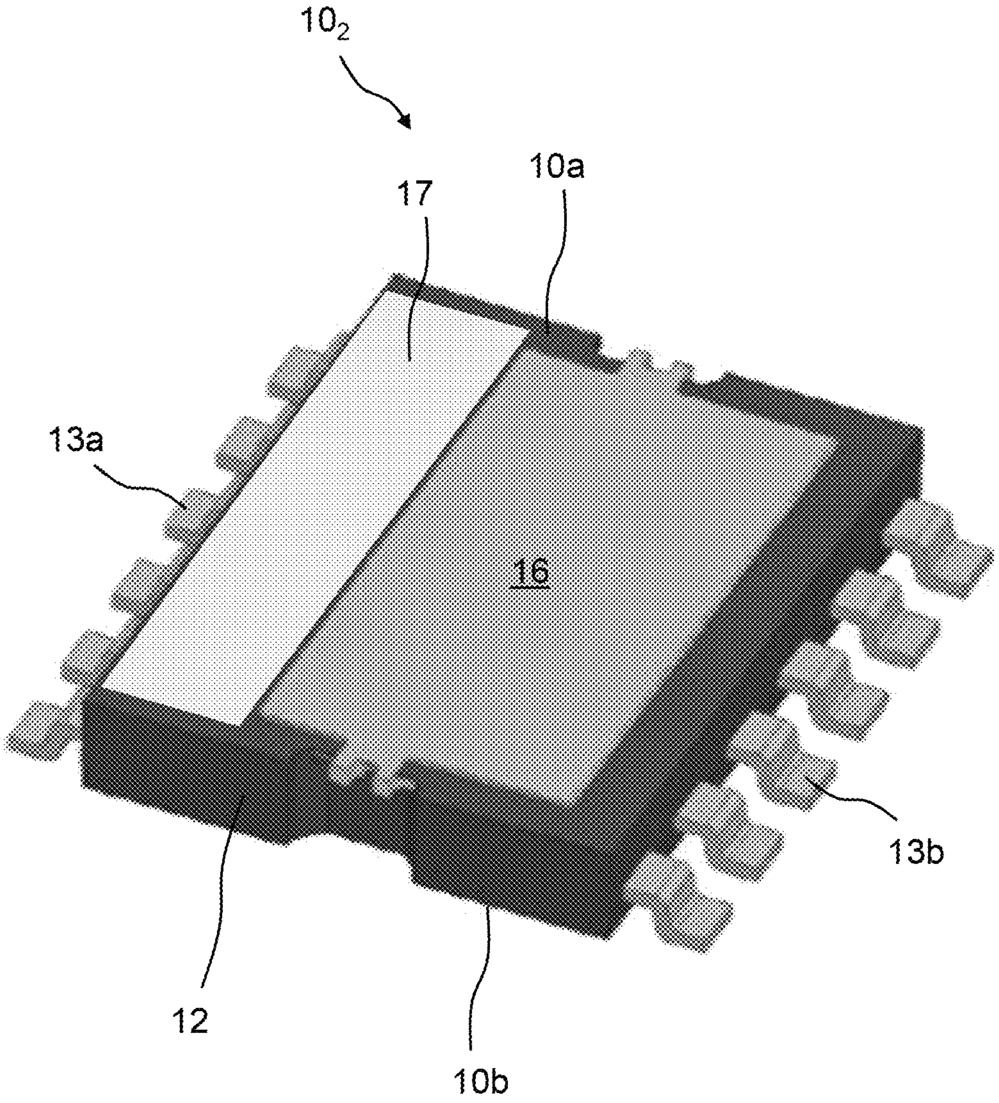
Figure 1C:
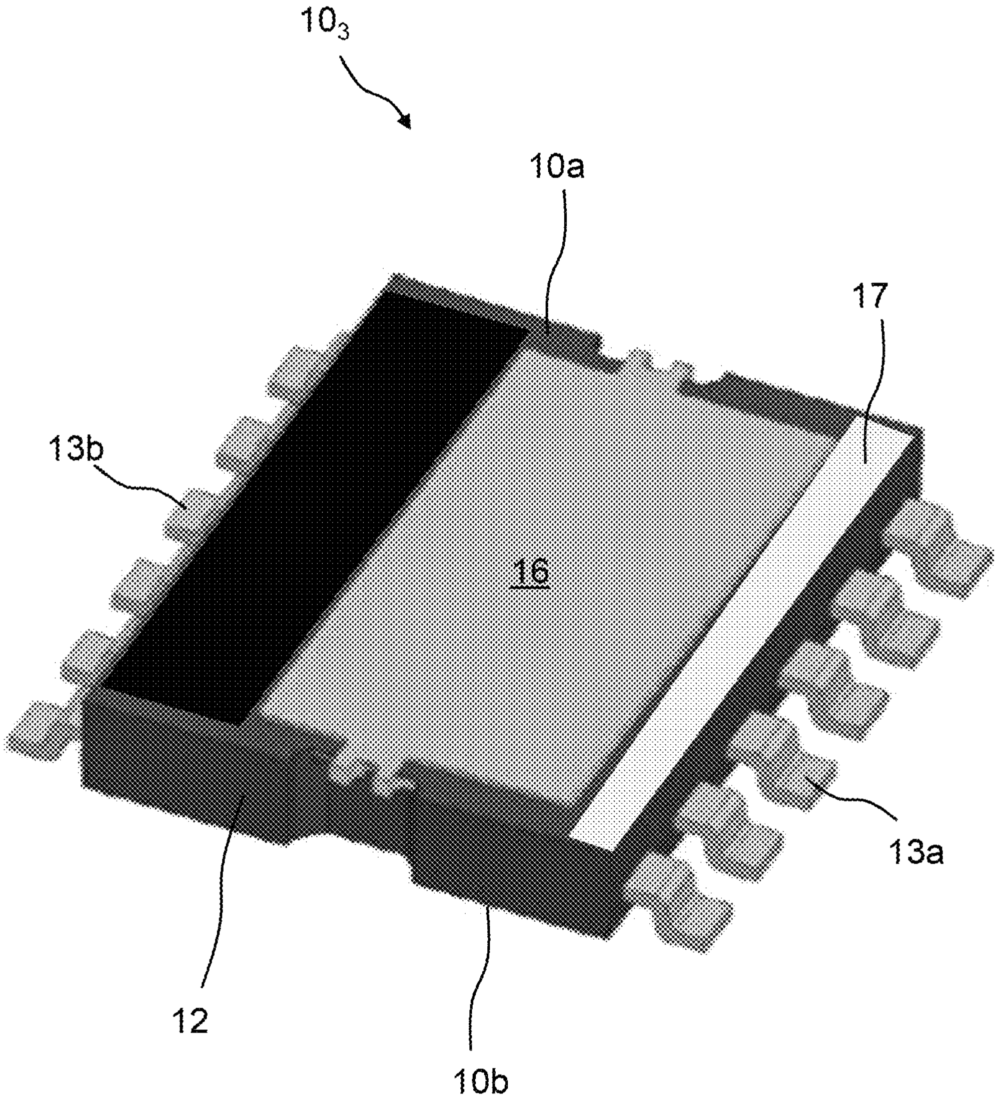
Figure 1D:
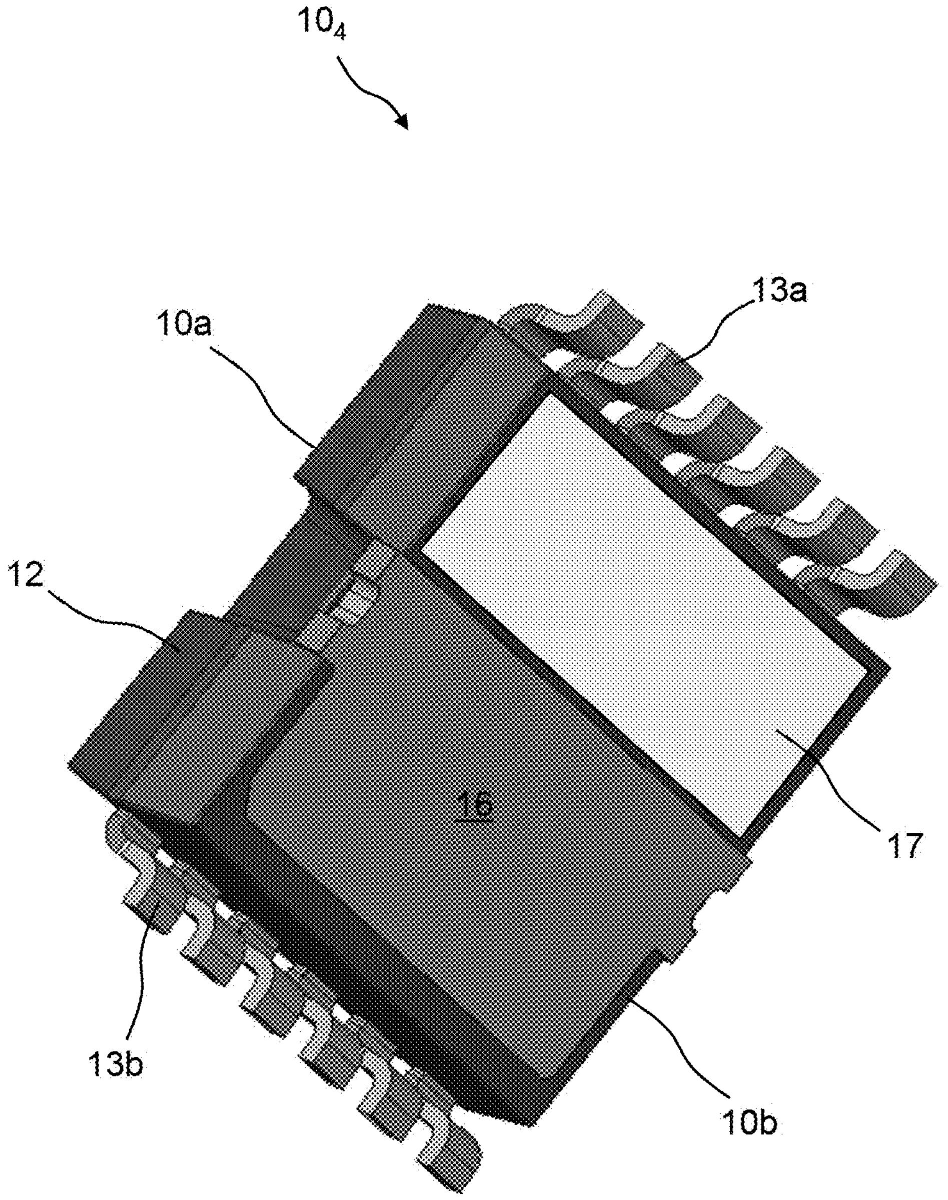
Figure 1E:
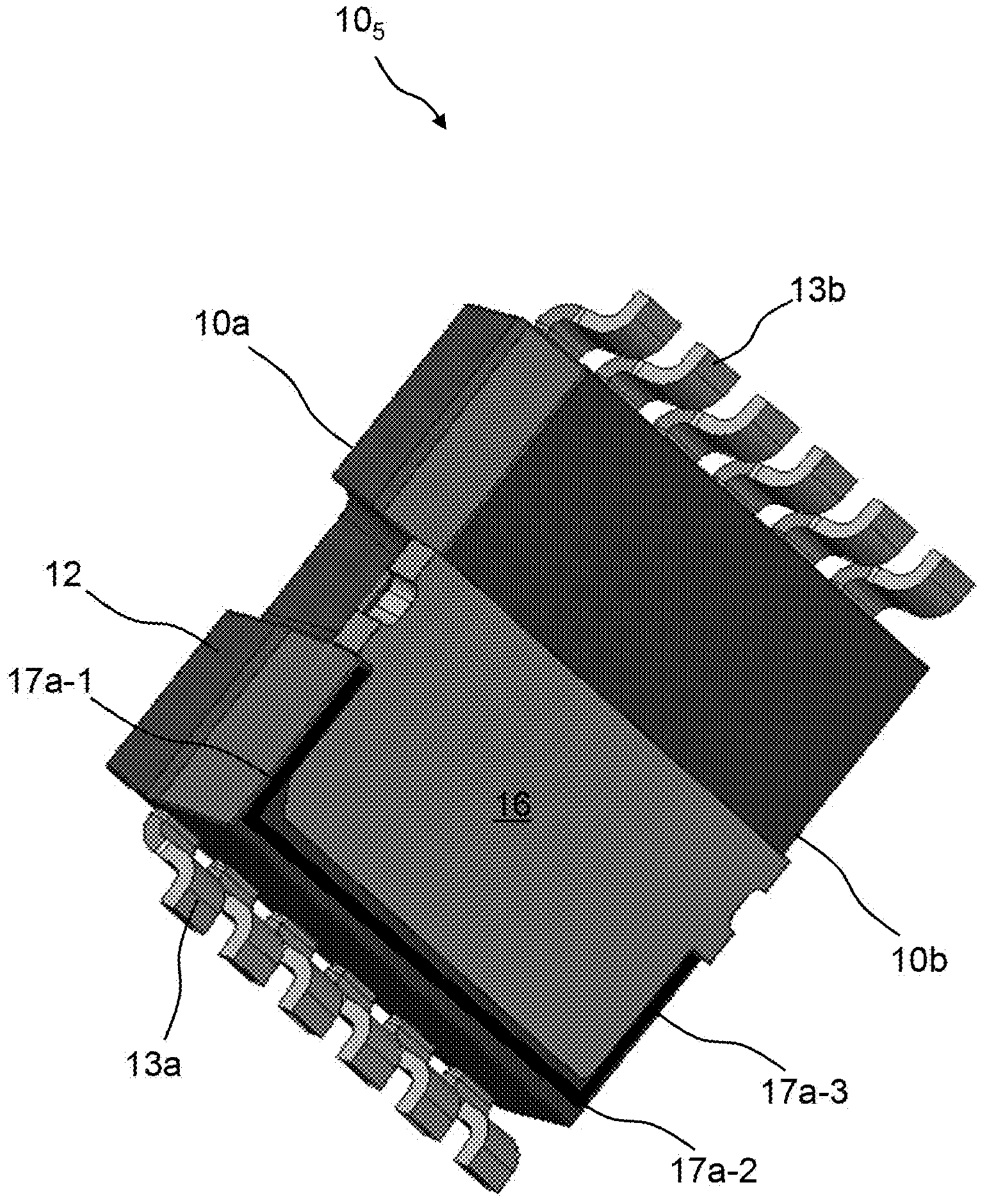
Figure 1F:
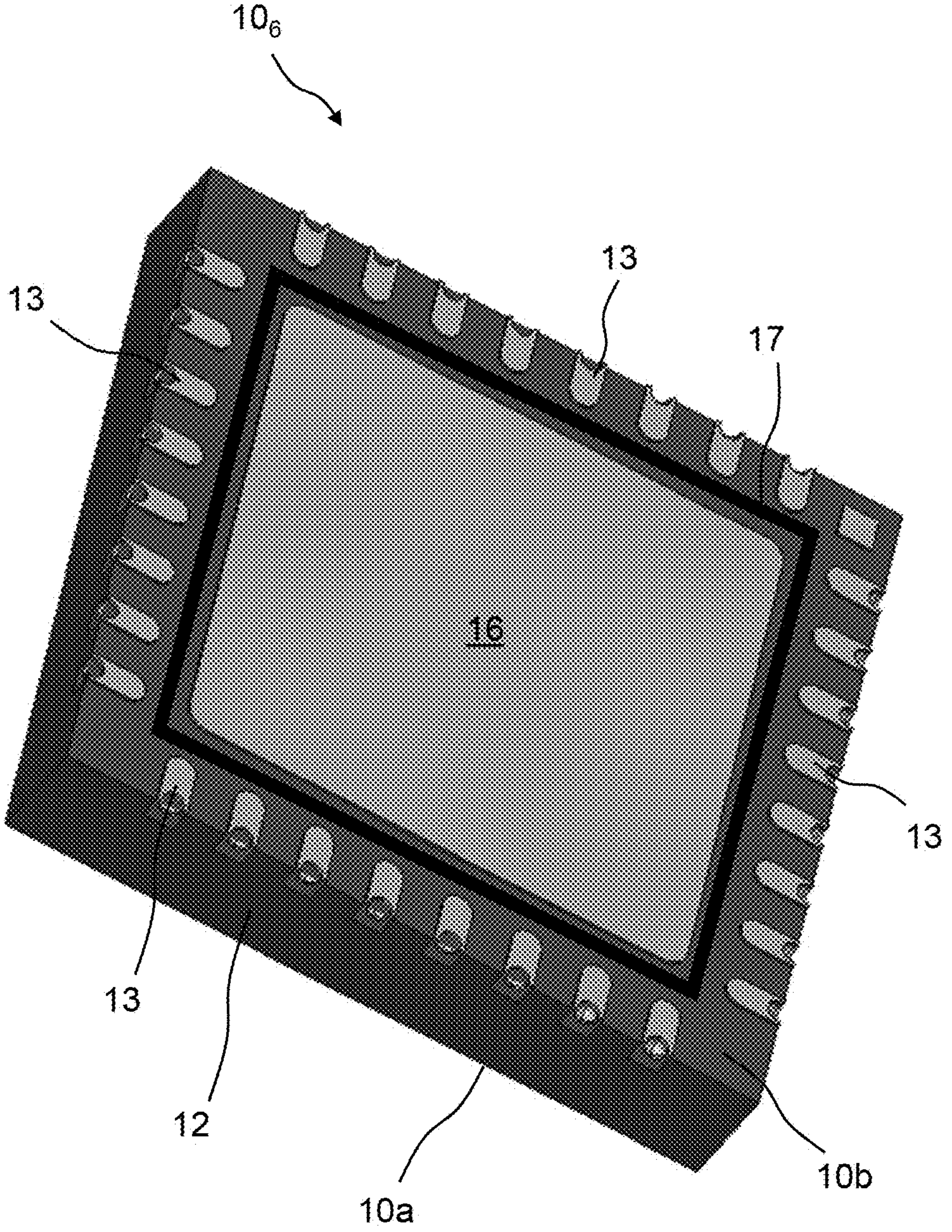

In FIGS. 1A, 1B and 1C the heat sink element 16 and the silicate containing mineral 17 are positioned at a first, top surface side 10*a* of the semiconductor package assemblies $\mathbf{10}_1$, $\mathbf{10}_2$ and $\mathbf{10}_3$, shielding the heat sink 16 from the leads 13*a* (which are on a different potential level than the heat sink 16). In examples of FIGS. 1D and 1E the heat sink element 16 and the silicate containing mineral 17 are positioned at a second, bottom surface side 10*b* of the semiconductor package assemblies 104 and 105. In all examples the semiconductor package assemblies $\mathbf{10}_1$-$\mathbf{10}_6$ are to be mounted with their second, bottom surface side 10*b* on a PCB (no shown), and the silicate containing mineral 17 is electrically shielding the heat sink 16 from the leads 13*a* (which are on a different potential level than the heat sink 16), thereby limiting the risk of arcing. In FIG. 1E strips 17*a*-1, 17*a*-2, 17*a*-3 of silicate containing mineral are partially positioned around the heat sink 16 shielding the leads 13*a* (which are on a different potential level). In addition, the example of FIG. 1F, shows a leadless semiconductor package assembly $\mathbf{10}_6$.

FIGS. 2A-2D depict various manufacturing steps of a method according to the disclosure. The method intends to form at least one semiconductor package $\mathbf{10}_1$-$\mathbf{10}_6$ by means of the sub-steps of step i1) of providing a lead frame 14 made from a metal material having a first frame side 14*a* and a second frame side 14*b* opposite to the first frame side 14*a* as well as having at least two terminals 13; step i2) of providing at least one semiconductor die structure 15 having a first die side 15*a* and a second die side 15*b* opposite to the first die side 15*a* with its second die side 15*b* on the first frame side 14*a* of the lead frame 14, for example at the location of a die paddle 14*z* (see FIG. 2B).

The next step i3) pertains to electrically and mechanically attaching the at least one semiconductor die structure 15 to the terminals 13 of the lead frame 14, for example with the use of bond clips or bond wires 130. Moreover, see FIG. 2B, in a next step i4) a heat sink element 16 is attached on the first die side 15*a* and/or the second die side 15*b* of the semiconductor die structure 15 or optionally to the lead frame 14.

Prior to the encapsulating step ii) for encapsulating the at least one semiconductor die structure 15, the heat sink element 16, the lead frame 14 and the plurality of terminals 13 with a molding resin 12, the method performs the step iii) of providing a layer 17, 17*a*, 17*b* comprised of at least a silicate containing mineral on the lead frame 14 and/or the semiconductor die structure 15 adjacent to the heat sink element 16.

Various techniques can be applied for providing the layer 17, 17*a*, 17*b* comprised of at least a silicate containing mineral on the lead frame 14 and/or the semiconductor die structure 15 adjacent to the heat sink element 16.

One technique involves a printing technique of the silicate containing mineral into one or more overlapping layers 17, 17*a*, 17*b*.

Figure 2A:
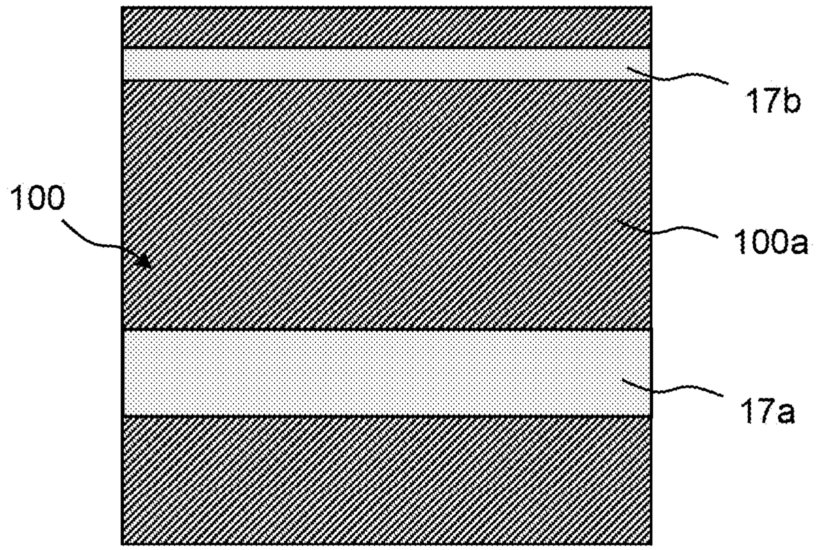
FIGS. 2A, 2B, 2C and 2D depict various manufacturing steps of a method according to the disclosure.
Figure 2B:
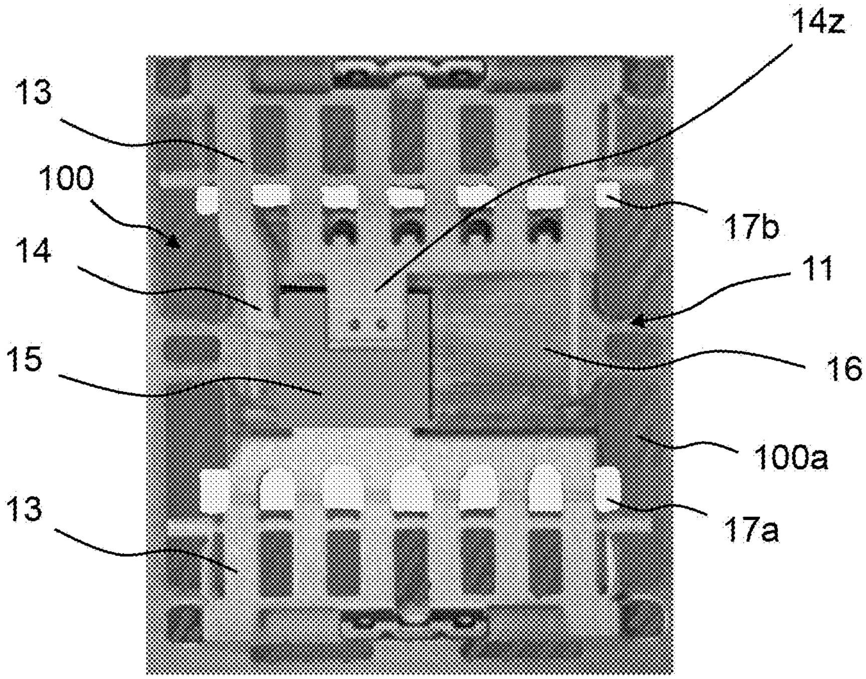
Figure 2C:
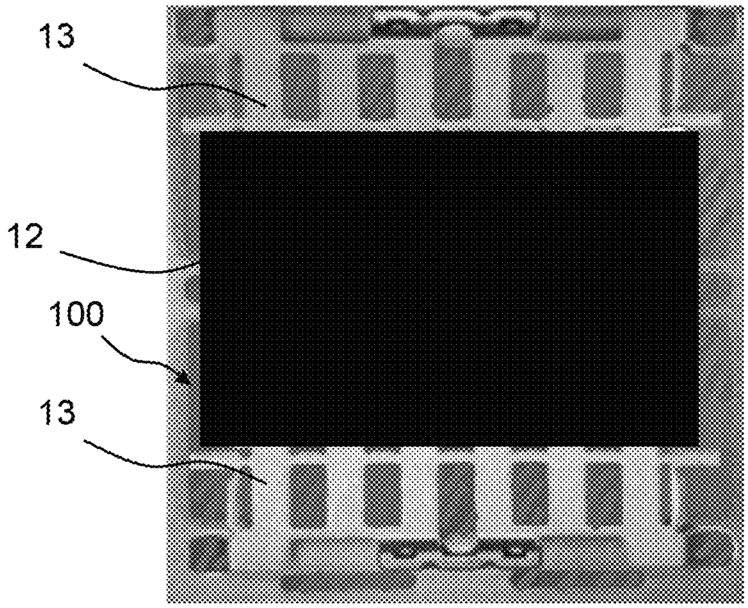
Figure 2D:
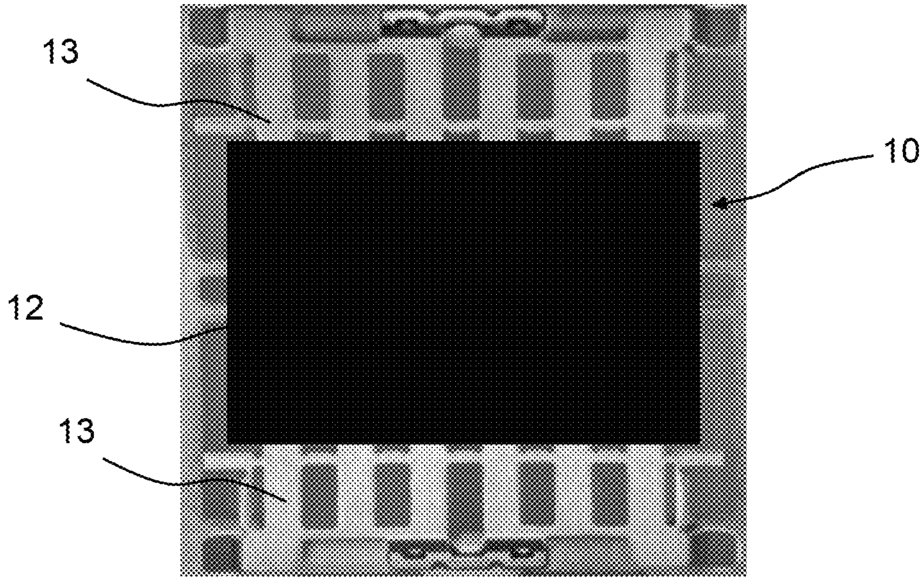

Another technique is disclosed in FIG. 2A. In the method step of FIG. 2A, an adhesive tape 100 with an adhesive side 100*a* is provided. On the adhesive side 199*a* at least one layer 17, 17*a*, 17*b* comprised of the at least a silicate containing mineral is provided, for example with a length dimension more or less equal to a width dimension of the lead frame 14. The lead frame 14 is adhered with one of its a lead frame sides (here the second lead frame side 14*b*) on the adhesive side 100*a* of the adhesive tape 100, such the at least one layer 17, 17*a*, 17*b* of the at least a silicate containing mineral is sandwiched between the tape 100 and the lead frame 14.

After the step of adhering the lead frame 14 to the adhesive tape 100, the previous outlined steps are performed: mounting the least one semiconductor die structure 15 with its second die side 15*b* on the first frame side 14*a* of the lead frame 14, for example at the location of a die paddle 14*z* (see FIG. 2B), electrically and mechanically attaching the at least one semiconductor die structure 15 to the terminals 13 of the lead frame 14 and attaching the at least one heat sink element 16 on the first die side 15*a* and/or the second die side 15*b* of the semiconductor die structure 15 or optionally to the lead frame 14.

Subsequently, the encapsulating step is performed with the encapsulant 12 leaving the first heat sink side 16*a* of the heat sink element 16, optionally the layer 17, 17*a*, 17*b* of the at least a silicate containing mineral and the leads or terminals 13 exposed, thereby forming at least one encapsulated semiconductor package assembly $\mathbf{10}_1$-$\mathbf{10}_6$.

The efficiency of the manufacturing method according to the disclosure allows for manufacturing a large number of encapsulated semiconductor package assemblies $\mathbf{10}_1$-$\mathbf{10}_6$, using an adhesive tape having an adhesive side and containing multiple layers, each comprised of the at least a silicate containing mineral on the adhesive side at certain locations conformal to the number semiconductor packages 11 to be formed on a matrix shaped lead frame 14 containing multiple die paddles 14*z* and leads 13.

After encapsulation, the individual semiconductor package assemblies $\mathbf{10}_1$-$\mathbf{10}_6$ can be created using known singulation and lead forming techniques.

LIST OF REFERENCE NUMERALS $\mathbf{10}_1$-$\mathbf{10}_6$ semiconductor package assembly (examples of the disclosure)
11 semiconductor package
12 molding resin case
13*a*-13*b* leads/terminals
130 bond element
14 lead frame
14*a* first side of lead frame
14*b* second side of lead frame
14*z* lead frame die paddle
15 semiconductor die structure
15*a* first die side of semiconductor die structure
15*b* second die side of semiconductor die structure
16 heat sink
16*a* first side of heat sink
16*b* second side of heat sink
17; 17*a-n*; 17*b* layer comprised of at least a silicate containing mineral
100 tape
100*a* adhesive side of tape

The invention claimed is:

1. A method for manufacturing a semiconductor package assembly, comprising the steps of:

i) forming at least one semiconductor package by the following sub-steps:

i1) providing a lead frame made from a metal material having a first frame side and a second frame side opposite to the first frame side and at least two terminals;

i2) providing at least one semiconductor die structure having a first die side and a second die side opposite to the first die side with the second die side on the first frame side of the lead frame;

i3) electrically and mechanically attaching the at least one semiconductor die structure to the terminals of the lead frame;

i4) attaching a heat sink element on the first die side and/or the second die side of the semiconductor die structure; and ii) encapsulating the at least one semiconductor die structure, the heat sink element and the plurality of terminals with a molding resin leaving at least a portion of the heat sink and at least a portion of the at least two terminals exposed, thereby forming at least one encapsulated semiconductor package assembly; and iii) prior to the encapsulating step ii), providing a layer comprised of at least a silicate containing mineral on the lead frame and/or the semiconductor die structure adjacent to the heat sink element.

2. The method according to claim 1, wherein step iii) is performed prior to step i2), and comprises:

providing an adhesive tape having an adhesive side and at least one layer comprises the at least a silicate containing mineral on the adhesive side; and mounting at least the lead frame on the adhesive side of the adhesive tape.

3. The method according to claim 1, wherein the silicate containing mineral is mica.

4. The method according to claim 1, wherein the at least one layer comprised of the at least a silicate containing mineral layer surrounds the heat sink element.

5. The method according to claim 1, wherein the at least one layer comprised of the at least a silicate containing mineral layer is adjacent to the terminals of the lead frame.

6. The method according to claim 2, wherein step iii) is followed by the step of:

vi) removing the adhesive tape leaving the at least one layer comprised of the at least a silicate containing mineral exposed.

7. The method according to claim 2, wherein the silicate containing mineral is mica.

8. The method according to claim 2, wherein the at least one layer comprised of the at least a silicate containing mineral layer surrounds the heat sink element.

9. The method according to claim 2, wherein the at least one layer comprised of the at least a silicate containing mineral layer is adjacent to the terminals of the lead frame.

10. A semiconductor package assembly consisting of a semiconductor package and a molding resin case as manufactured in accordance with the method of claim 1, wherein the semiconductor package comprises:

a lead frame made from a metal material having a first frame side and a second frame side opposite to the first frame side and having at least two terminals;

at least one semiconductor die structure having a first die side and a second die side opposite to the first die side with the second die side on the first frame side of the lead frame;

a plurality of connections electrically and mechanically connecting the at least one semiconductor die structure with the terminals of the lead frame;

at least one heat sink element mounted to the semiconductor die structure;

at least one layer comprising at least a silicate containing mineral at least adjacent to the at least one heat sink element; and a molding resin encapsulating the at least one semiconductor die structure, the at least one heat sink element, the plurality of terminals and the at least one layer comprised of at least a silicate containing mineral with a molding resin leaving at least a portion of the heat sink and at least a portion of the at least two terminals exposed.

11. The semiconductor package assembly according to claim 10, wherein the silicate containing mineral is mica.

12. The semiconductor package assembly according to claim 10, wherein the at least one layer comprised of the at least a silicate containing mineral layer is positioned around the heat sink element.

13. The semiconductor package assembly according to claim 10, wherein the at least one layer comprised of the at least a silicate containing mineral layer is positioned adjacent to the terminals of the lead frame.

14. The semiconductor package assembly according to claim 11, wherein the at least one layer comprised of the at least a silicate containing mineral layer is positioned around the heat sink element.

15. The semiconductor package assembly according to claim 11, wherein the at least one layer comprised of the at least a silicate containing mineral layer is positioned adjacent to the terminals of the lead frame.

16. The semiconductor package assembly according to claim 12, wherein the at least one layer comprised of the at least a silicate containing mineral layer is positioned adjacent to the terminals of the lead frame.

* * * * *